US006545547B2

(12) United States Patent
Fridi et al.

(10) Patent No.: US 6,545,547 B2
(45) Date of Patent: Apr. 8, 2003

(54) METHOD FOR TUNING A VCO USING A PHASE LOCK LOOP (75) Inventors: Ahmed Reda Fridi, Dallas, TX (US); Abdellatif Bellaouar, Dallas, TX (US); Sherif Embabi, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/929,677

(22) Filed: Aug. 13, 2001

(65) Prior Publication Data

US 2002/0036545 A1 Mar. 28, 2002

Related U.S. Application Data (60) Provisional application No. 60/226,348, filed on Aug. 18, 2000.

(51) Int. Cl.[7] .................................. H03L 7/00
(52) U.S. Cl. ......................................... 331/16; 331/17
(58) Field of Search ............................. 331/16, 1 A, 14, 331/1 R, 187, 17; 327/147, 150, 156, 159

(56) References Cited

U.S. PATENT DOCUMENTS

| 4,272,729 | A | * | 6/1981 | Riley, Jr. .................... 331/1 A |
| 4,703,520 | A | | 10/1987 | Rozanski, Jr. et al. |
| 5,262,957 | A | | 11/1993 | Hearn |
| 5,355,098 | A | * | 10/1994 | Iwasaki ........................ 331/14 |
| 5,831,482 | A | * | 11/1998 | Salvi et al. .................. 331/1 R |
| 5,978,425 | A | * | 11/1999 | Takla ......................... 327/159 |
| 6,064,947 | A | * | 5/2000 | Sun et al. .................... 331/187 |
| 6,097,244 | A | * | 8/2000 | Chen .......................... 327/308 |
| 6,172,579 | B1 | * | 1/2001 | Dacus et al. ................... 331/17 |
| 6,242,956 | B1 | * | 6/2001 | McCollough et al. ........ 327/154 |
| 2002/0036545 | A1 | | 3/2002 | Eridi et al. |

FOREIGN PATENT DOCUMENTS

| EP | 1 189 351 A2 | 3/2002 |
| WO | WO 9904495 A | * | 1/1999 |

OTHER PUBLICATIONS

Zuta, Marc, "A New PLL with Fast Settling Time and Low Phase Noise," Microwave Journal, Jun. 1998, pp. 94, 96, 98, 100, 102, 104, 106, 108.

Heinen, Dr. Stefan, "Mobility by Innovation," pp. 40–41, International Microwave Symposium, Apr. 2000, Boston, MA.

* cited by examiner

Primary Examiner—Kenneth B. Wells
Assistant Examiner—Cassandra Cox
(74) Attorney, Agent, or Firm—Pedro P. Hernandez; W. James Brady, III; Frederick J. Telecky, Jr.

(57) ABSTRACT

A very fast lock integer N PLL with hybrid digital coarse VCO tuning and VCO temperature drift compensation provides for a fully digital tuning scheme without the need for charge pumps. A PLL synthesizer (300) using such a PLL design provides for very fast lock times by using an open loop step and a closed loop step. The hybrid PLL can achieve coarse tuning within four clock cycles, while minimizing any errors caused by the VCO non-linearity. Temperature tracking and compensation is also provided. A SAR implementation (100) and an interpolation tuning implementation (200) are also described.

11 Claims, 12 Drawing Sheets

METHOD FOR TUNING A VCO USING A PHASE LOCK LOOP

CROSS-REFERENCE TO RELATED APPLICATIONS

This application claims the benefit of U.S. Provisional Application No. 60/226,348, entitled "Very fast lock integer N PLL with hybrid digital coarse VCO tuning and VCO temperature drift compensation", filed on Aug. 18, 2000.

TECHNICAL FIELD

This invention relates in general to the field of electronics and more specifically to phase lock loops.

BACKGROUND

In emerging wireless communication systems such as third generation wideband code division multiple access (WCDMA), General Packet Radio Services (GPRS)/Global System of Mobile communications (GSM), etc. the requirements for small channel spacing and fast lock times makes designing a phase lock loop (PLL) design more and more difficult. In a conventional PLL, fast lock times and small channel spacing is usually achieved by using a fractional N PLL, which enables a higher reference compare frequency, and wider loop filter bandwidth. A fractional N PLL implementation however has some limitations as it introduces fractional spurs that will put a limit on how wide the loop filter can be, and therefore will also limit the overall lock time.

In these new wireless applications, a PLL may also need high gain to compensate for temperature drift which will degrade and impact the phase noise and spurious levels of the overall design. Given the above problems, there exists a need in the art for a low spurious PLL that can achieve very fast lock times. It would also be beneficial to provide a PLL that requires no charge pumps and generates no fractional spurs.

BRIEF DESCRIPTION OF THE DRAWINGS

The features of the present invention, which are believed to be novel, are set forth with particularity in the appended claims. The invention, may best be understood by reference to the following description, taken in conjunction with the accompanying drawings, in the several figures of which like reference numerals identify like elements, and in which:

DETAILED DESCRIPTION OF THE PREFERRED EMBODIMENT

While the specification concludes with claims defining the features of the invention that are regarded as novel, it is believed that the invention will be better understood from a consideration of the following description in conjunction with the drawing figures, in which like reference numerals are carried forward.

The proposed scheme takes advantage in a fully integrated PLL that in a voltage controlled oscillator (VCO) calibration step can put the VCO frequency as close as possible from the desired lock frequency in an open loop configuration before letting the loop dynamic, in a closed loop configuration, achieve the final tuning of the VCO. A new tuning circuit enables, within four cycles, to bring the VCO within a few megahertz (MHz) from the desired channel while taking care of any VCO non-linearity or temperature drift.

Only 10 microseconds ($\mu$s) are typically needed with the new design to achieve coarse tuning, while another 60 to 70 $\mu$s are needed to then complete the PLL locking process with a compare frequency as low as 200 Hz. The use of an integer PLL using the present invention is no longer a limitation in terms of lock time and has the advantage of having better spur performance as compared to other fractional N PLL implementations.

Figure 3:
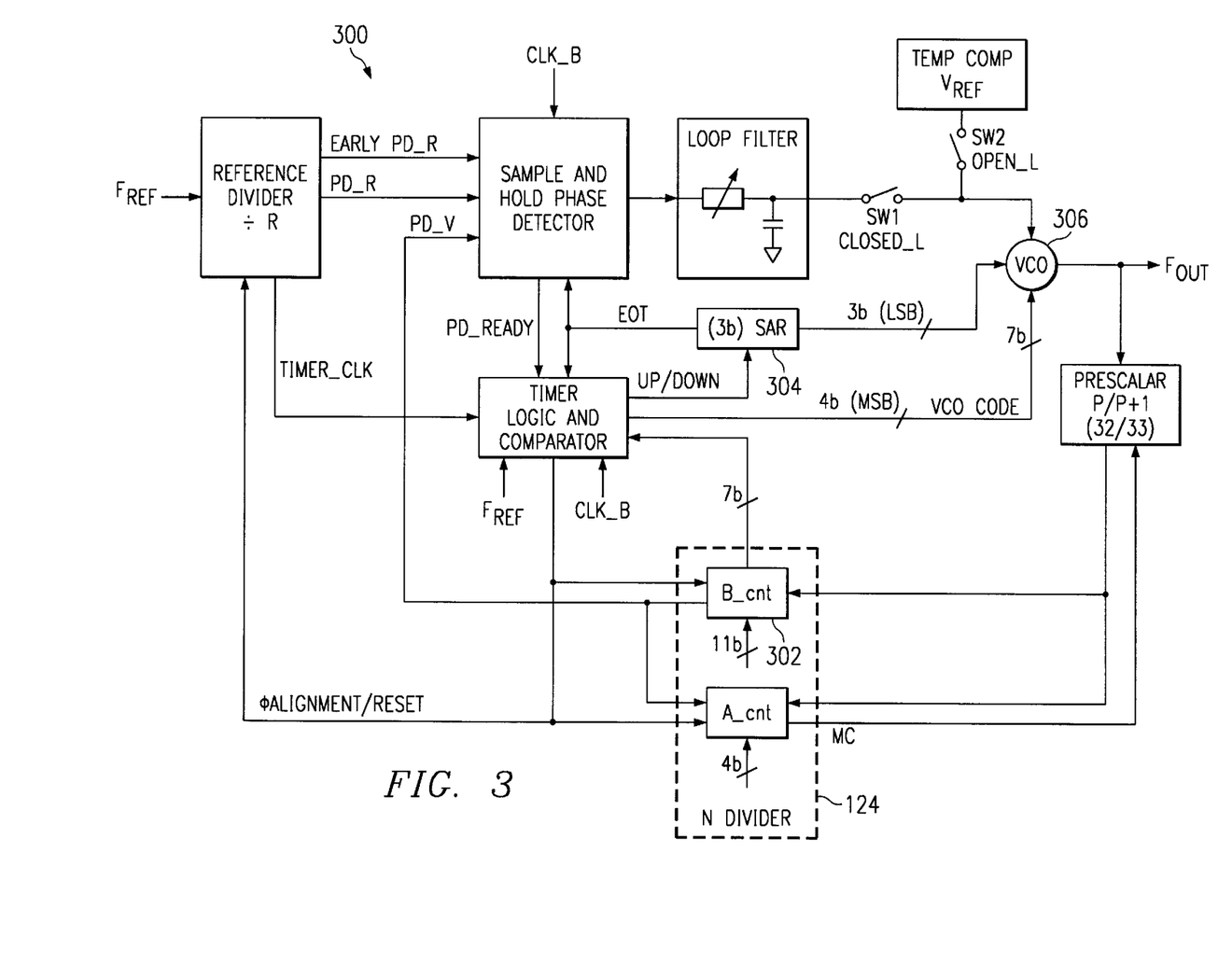
FIG. 3 shows a PLL using a hybrid tuning technique in accordance with still another embodiment of the invention.
Figure 4:
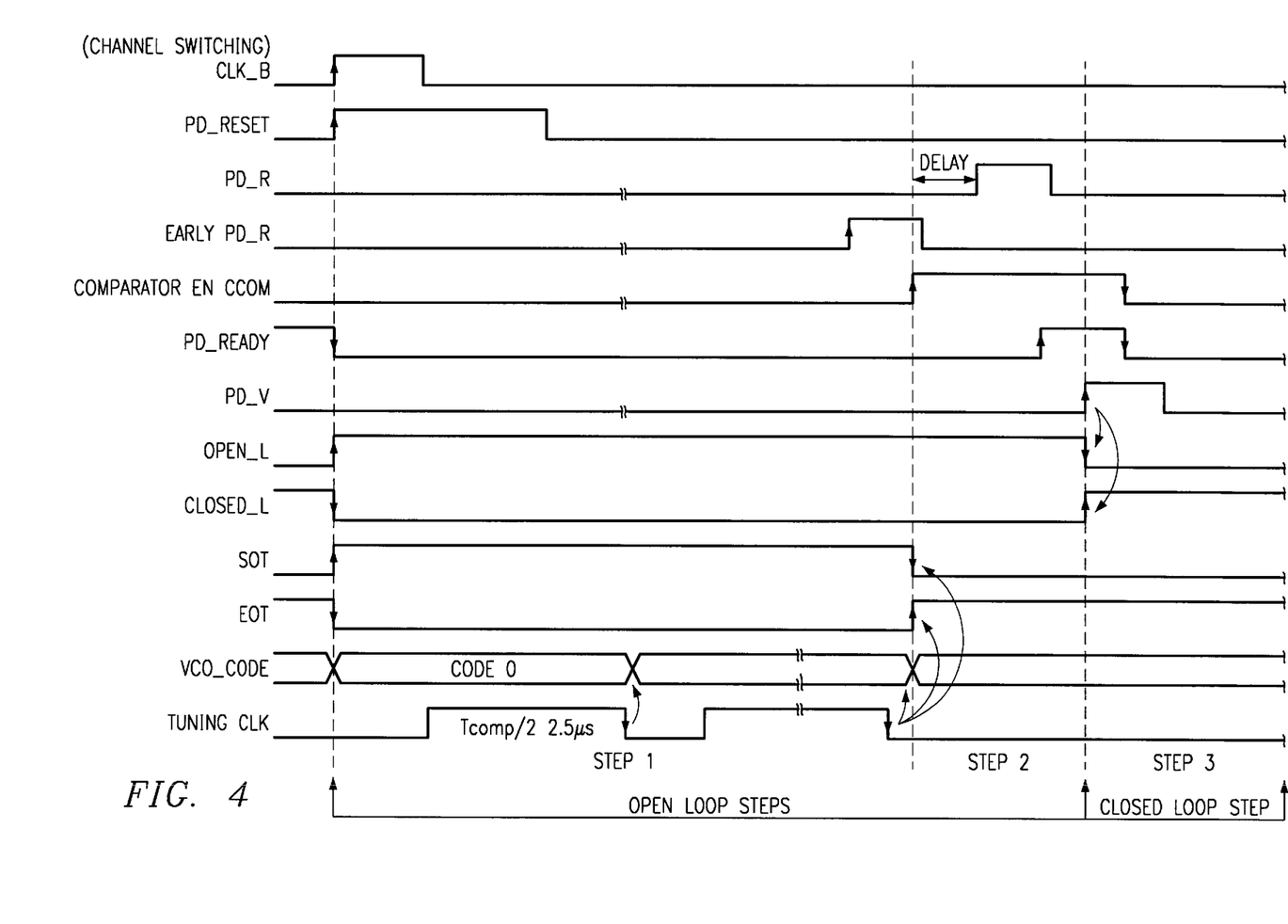
FIG. 4 shows a timing diagram in accordance with the invention.

In the preferred PLL embodiment shown in FIG. 3, by comparing an N divider output to a fixed timer clock, the digital VCO coarse tuning code bits are set and corrected. At the end of each timer cycle, the N divider content is used to set the next VCO coarse tuning code. The first calibration cycle relies on a linear interpolation principle to set the 4 most-significant-bits (MSBs) of the VCO code. The first calibration cycle relies on a linear interpolation principle to set the 4 MSBs of the VCO code. Each one of the remaining 3 least-significant-bits (LSBs) is then set using a 3 bit successive approximation register (SAR) which requires one complete clock cycle for each bit. The use of a SAR in the second phase allows the PLL to overcome any non-linearities in the VCO and guarantee a much more accurate tuning.

Figure 1:
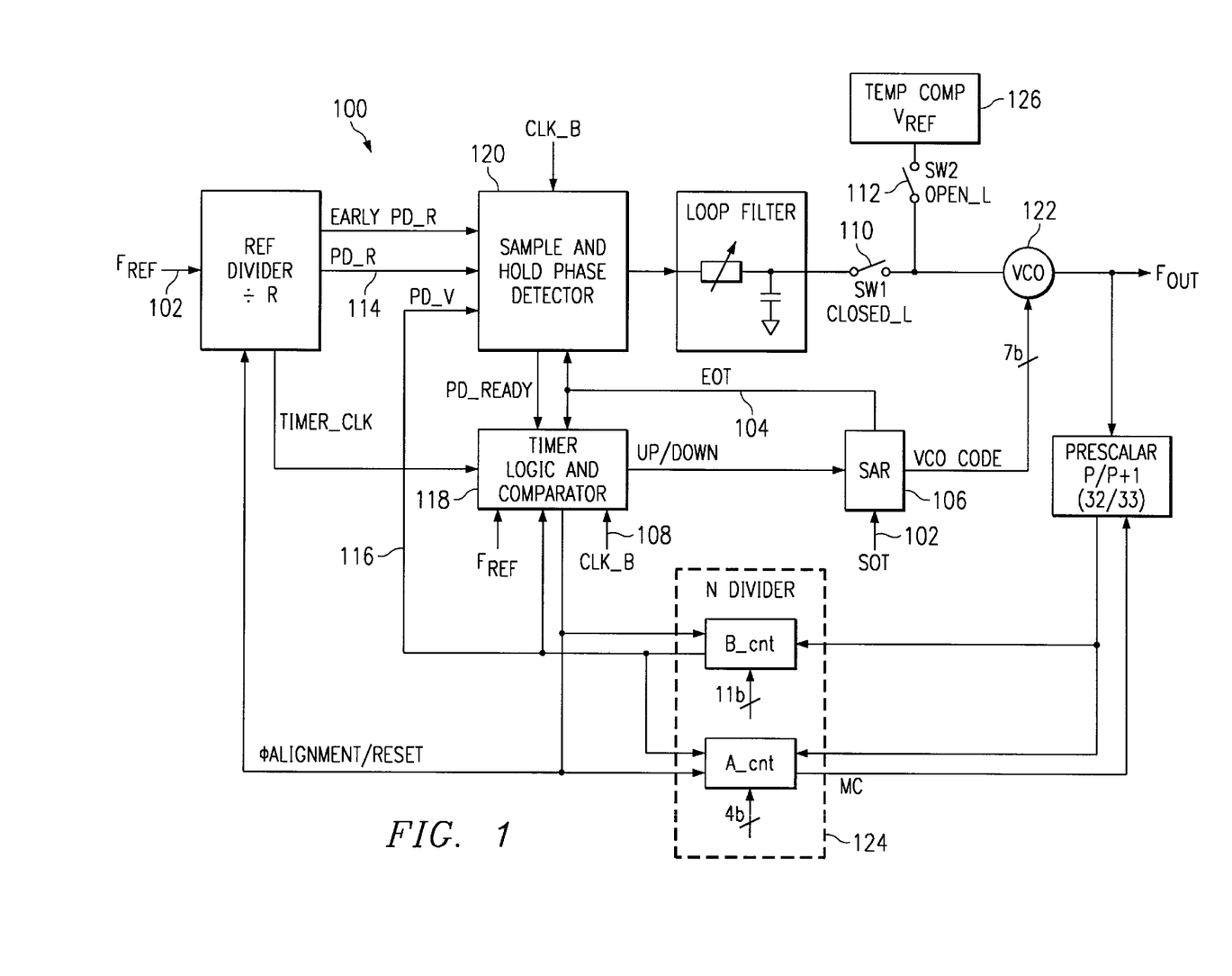
FIG. 1 shows a block diagram of a phase lock loop using a SAR tuning technique in accordance with the invention.
Figure 2:
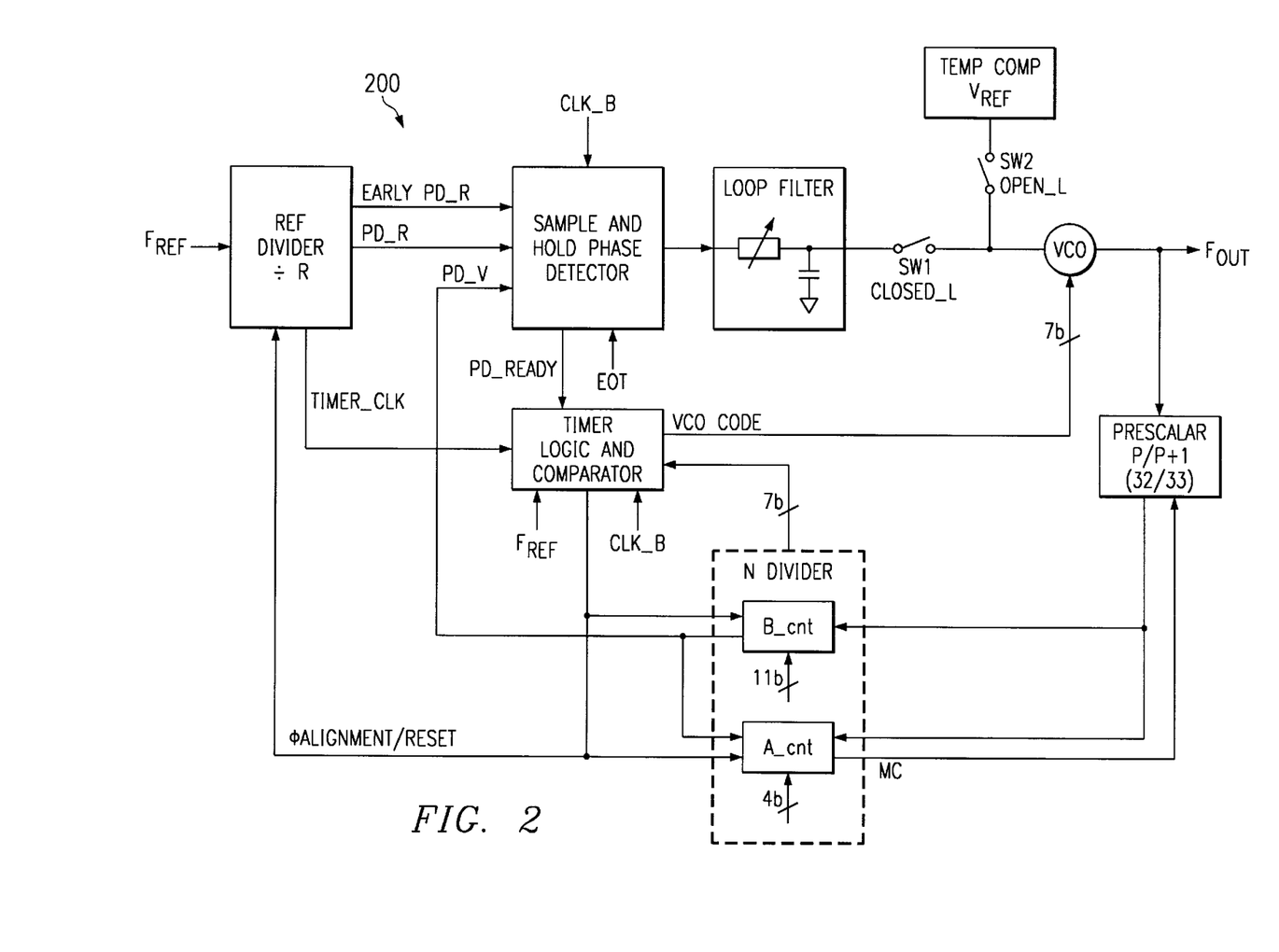
FIG. 2 shows a PLL using an interpolation tuning technique in accordance with another embodiment of the invention.

The lock process in the PLL is divided into two phases: an open loop phase; and a closed loop phase. Once a new channel is selected by the device using the PLL (e.g., cellular telephone, etc.), a control signal (CLK_B) such as channel switching signal 108 in FIG. 1 will open the loop via switch (SW1) 110 and set the VCO analog control line to a reference voltage through a second switch (SW2) 112. This open loop phase will go through two steps:

Step 1). The optimum digital VCO code is found that will bring the VCO frequency as close as possible from the desired locking frequency (e.g., within a few megahertz). The tuning can be done using three implementations. In FIG. 1 there is shown a PLL 100 using a SAR tuning implementation which is a binary search algorithm in accordance with the one embodiment of the invention. In FIG. 2, there is shown a PLL 200 using an interpolation type of tuning implementation in accordance with another embodiment of the invention. While in FIG. 3, there is shown a PLL 300 using a hybrid tuning scheme that takes advantage of both of the SAR and interpolation techniques to yield a more robust and optimum implementation in accordance with still another embodiment of the invention. A more detailed explanation of these three different PLL configurations will be presented further below.

Step 2). After step 1 is performed, and before the loop is closed a phase alignment between PD_R 114 and PD_V 116 is necessary. If the phase difference between the two signals at the phase detector input is not minimized and well controlled, the timer block 118 in the second phase (closed loop) would be very unpredictable and could take a very long time and would make the first step above useless in terms of achieving a fast lock time. It is also necessary during this step to ensure that the filter voltage is equal to the Vref voltage set at the analog VCO control line in order to avoid the VCO frequency from changing when switch (SW1) 110 is closed, to a value that gets out of the phase detector (PD) 120 narrowed tuning range. A voltage comparator (part of block 118) is used when the signal EOT (end-of-tuning) signal 104 is triggered to ensure that the Hold Voltage ($V_H$)=Vref before switch (SW1) 110 is closed.

At the end of the second step, the loop is put on ideal conditions to ensure that the fine analog VCO tuning is going to be done in the minimum number of reference cycles. The VCO 122 in the closed loop configuration operates in a low gain state helping achieve good phase noise performance and a low reference feed through spur level.

The VCO 122 is biased at Vref, which is equal approximately to Vcc/2. The digital tuning gives the characteristic that makes the mid-point frequency as close as possible from the desired one. In order to achieve this code search different options exist.

Figure 5:
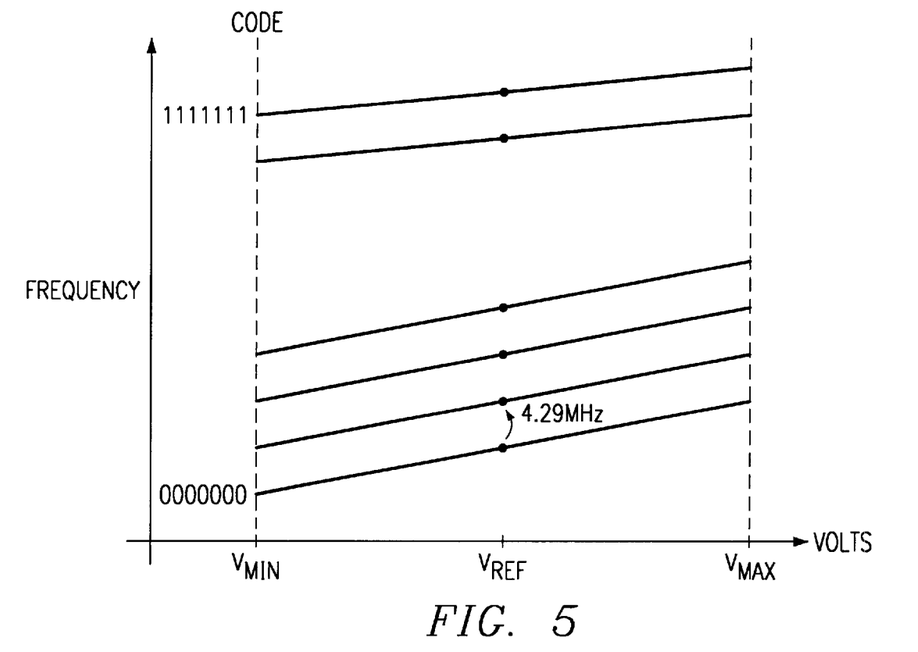
FIG. 5 shows a chart of Frequency versus voltage during the coarse tuning stage in accordance with the invention.

In FIG. 5 there is shown a frequency to voltage diagram highlighting the coarse tuning technique in an illustrative example where the frequency is 550 MHz and the number of bits being used is seven. Which yields a $\Delta F=550/2^7=4.29$ MHz.

Code Search Options for Use in Step 1 of the Open Loop Phase

Figure 6:
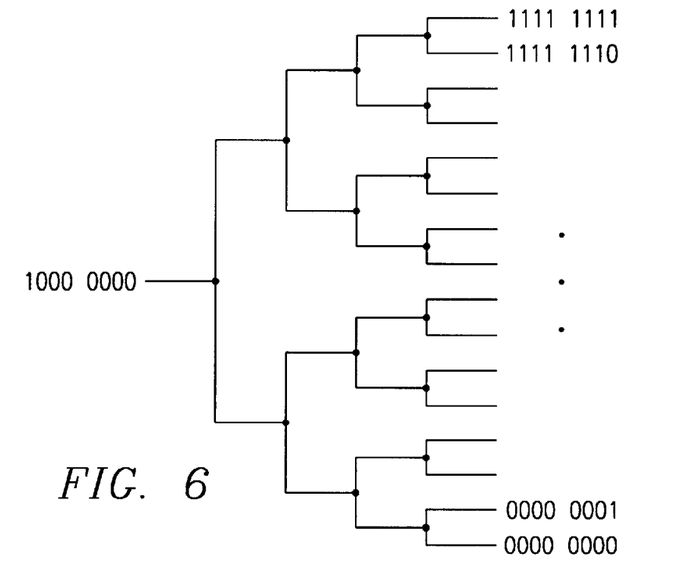
FIG. 6 shows an example of the number of tuning cycles required using the SAR technique.
Figure 7:
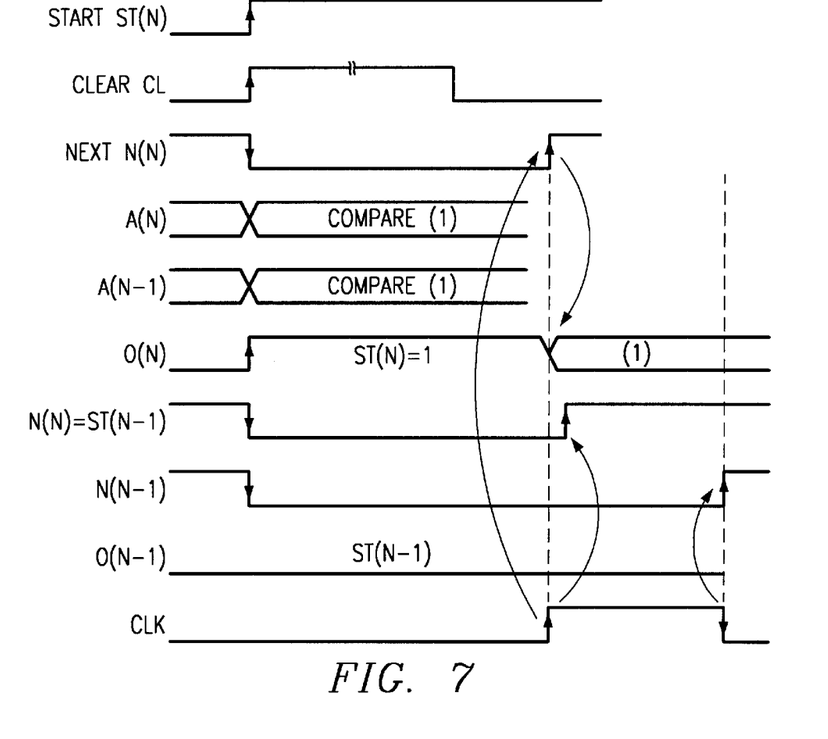
FIG. 7 shows a timing diagram for the SAR technique.

Option 1). SAR only technique used by the PLL synthesizer shown in FIG. 1: Comprises a binary search algorithm that compares the output of the reference counter to the N divider's 124 overflow. An edge detector detects whether the VCO frequency is faster or slower than the program value and will accordingly increment or decrement the tuning code value. The code bits are set from most-significant-bit (MSB) to least-significant-bit (LSB), and one bit per cycle. Thus for example, a 7 bit SAR will require 7 tuning cycles. In FIG. 6 there is shown an 8 bit SAR requiring 8 tuning cycles.

In FIG. 1, the start of tuning (SOT) signal 102, causes the PLL to commence its tuning sequence, once tuning is complete, an end of tuning (EOT) signal 104 is generated by the SAR circuit 106. A 7-bit SAR circuit 1000 is shown in FIG. 10 that can be used for SAR block 106. SAR circuit 1000 includes an edge detector 1006 which takes the form of an up/down detector which is used to compare the phase detector's reference signal (PD_R) 114 to the phase detector VCO signal (PD_V) 116.

Figure 8:
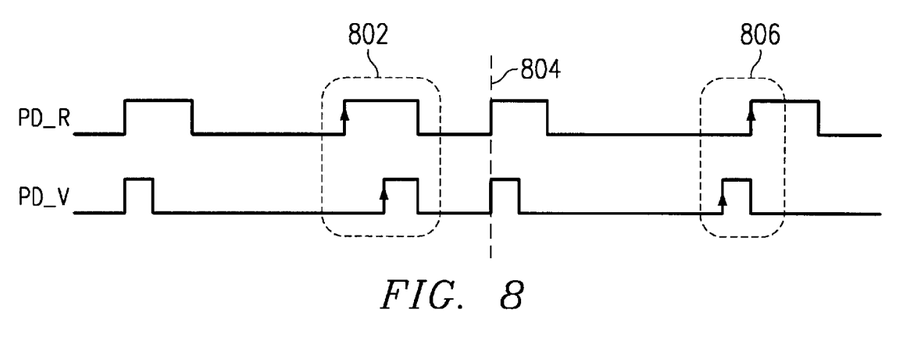
FIG. 8 shows a timing diagram illustrating when the VCO code is incremented/decremented using the SAR technique.
Figure 9:
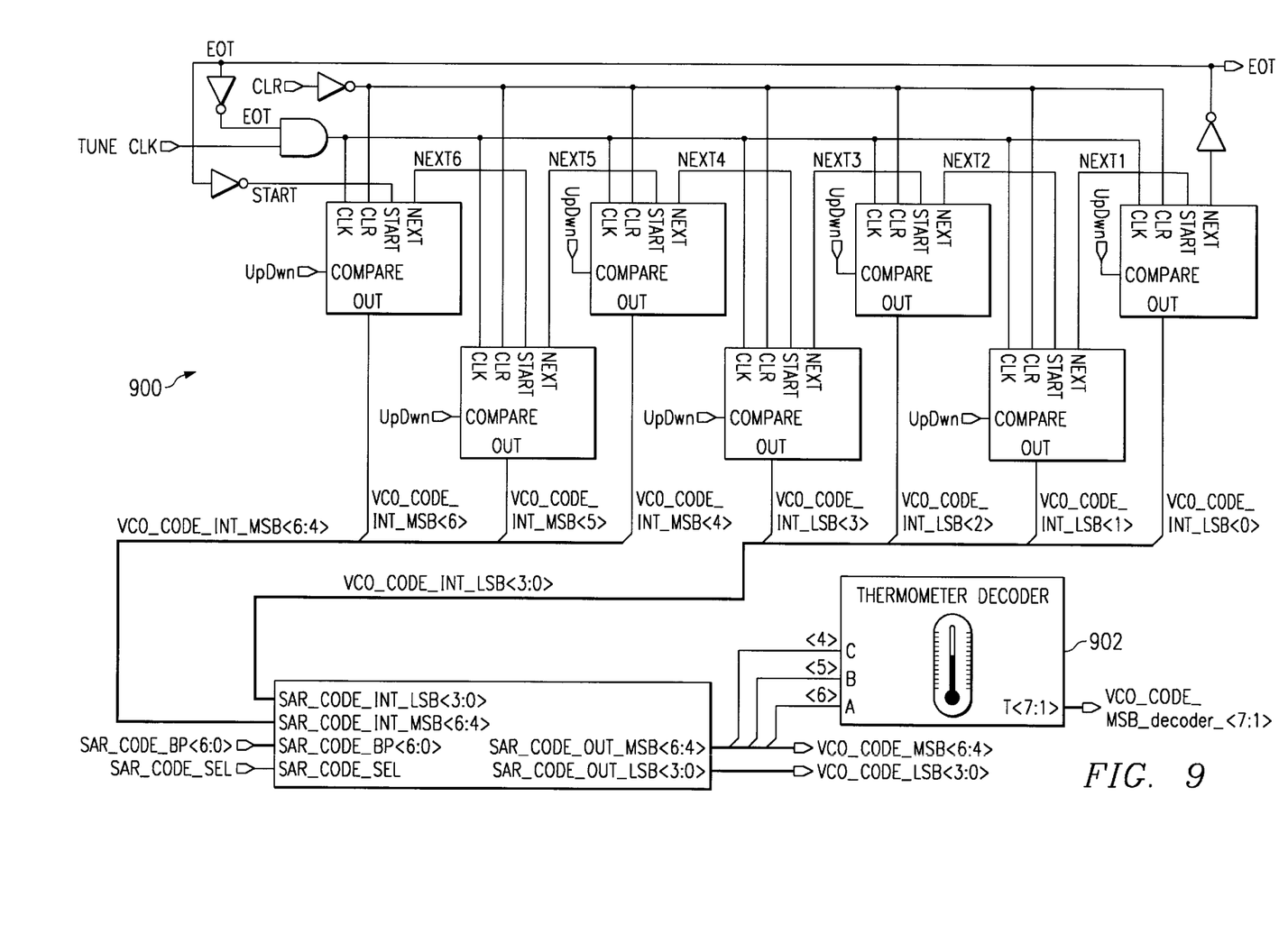
FIG. 9 shows a block diagram of a 7-bit SAR cell that can be used with the present invention.
Figure 10A:
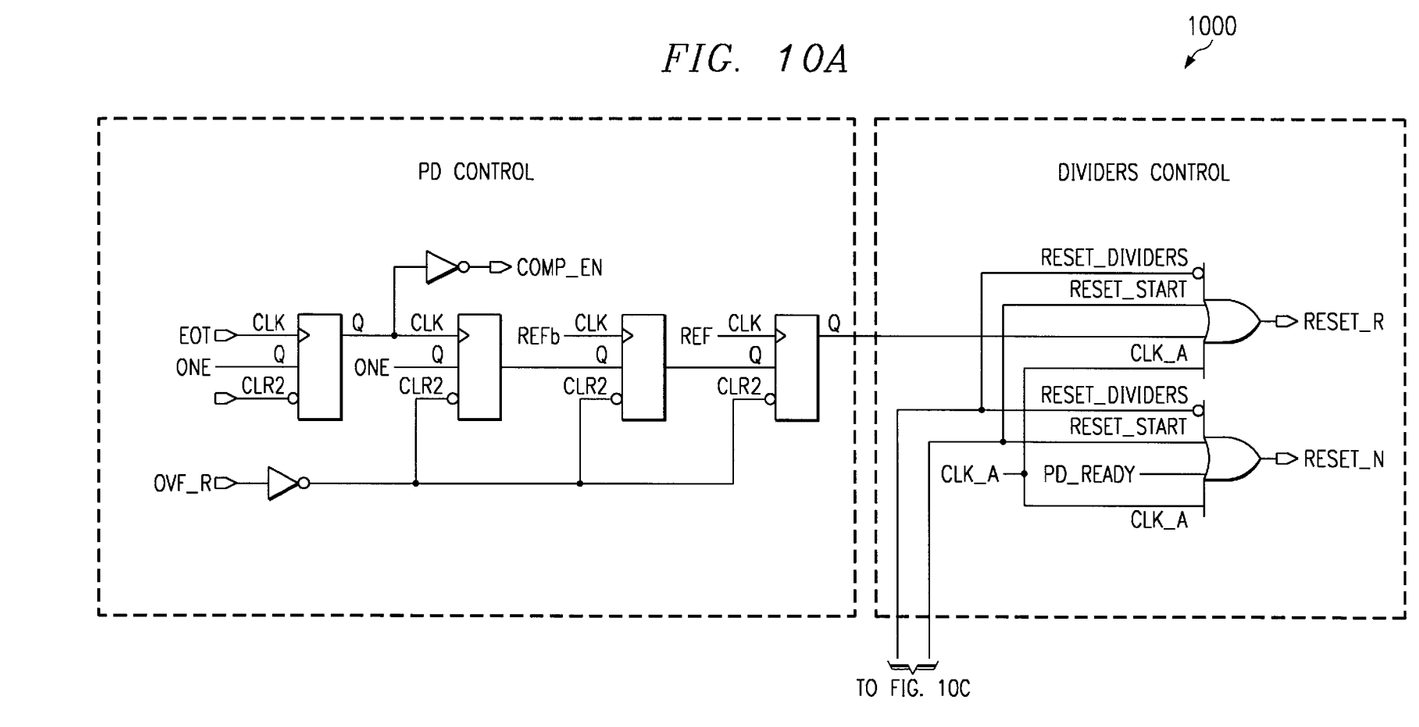
FIG. 10 shows a block diagram of a SARNCO timing controller and edge detector in accordance with the present invention.
Figure 10B:
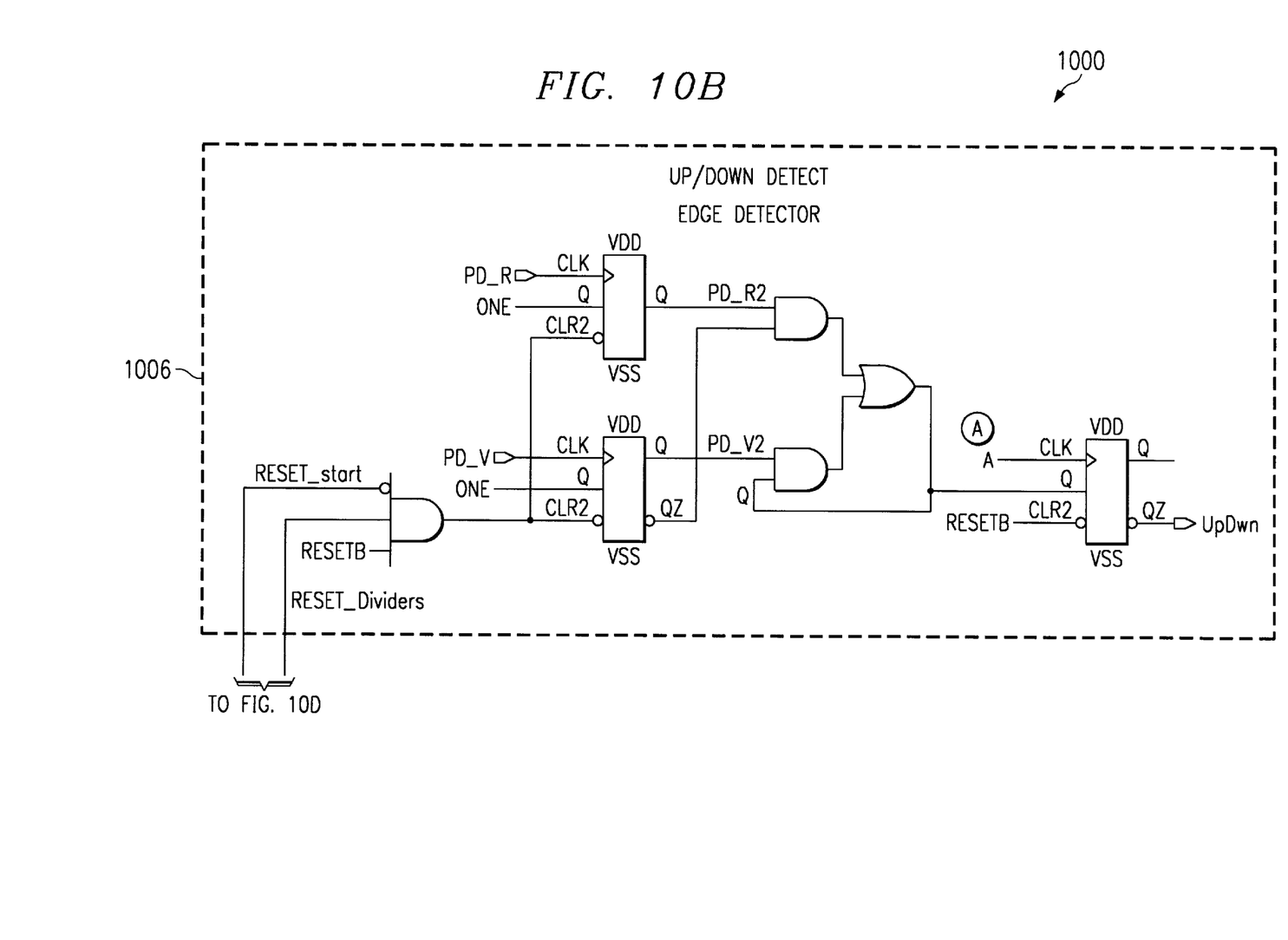
Figure 10C:
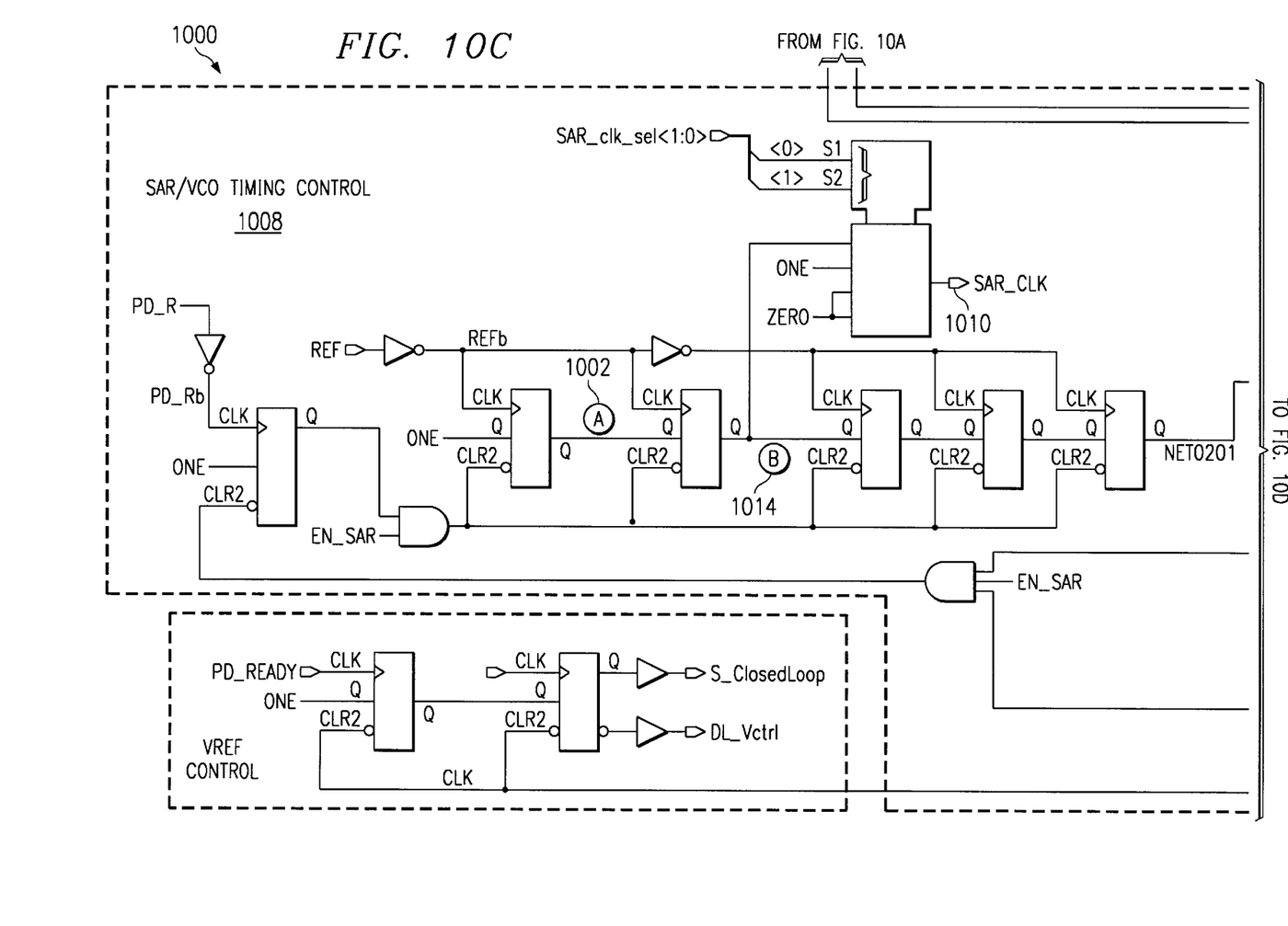
Figure 10D:
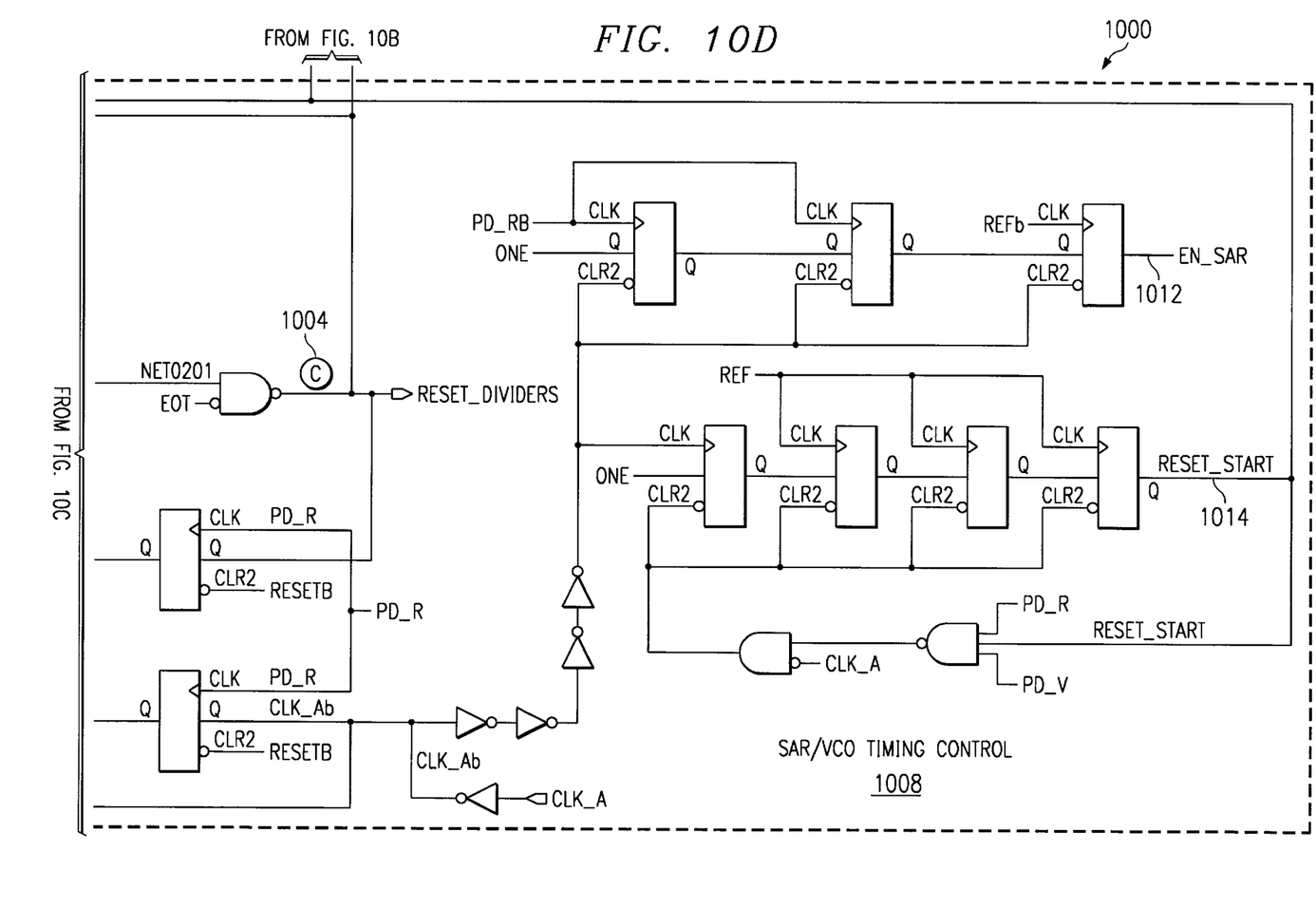

In FIG. 9, there is shown a 7-bit block diagram 900 of a SAR implementation such as for the SAR block 106 shown in FIG. 1. A three-bit version is used for the SAR block 304 of FIG. 3. The SAR block diagram 900 includes a thermometer decoder 902 that adjusts the MSBs of the VCO_Code In FIG. 8 there is shown a timing diagram highlighting the relationship of the PD_R and PD_V signals. In section 802 the PD_V signal is shown running slower than the PD_R signal which signifies that the VCO is slower and that the VCO code needs to be incremented by the SAR block 106 to the next "up branch" in the SAR decision tree shown in FIG. 6. In section 804 of the timing diagram, the VCO is shown running fast since the PD_V signal transitions from low to high occurs prior to the PD_R signal transition. This requires the SAR block to decrement the VCO code, which translates to going down one branch on the SAR tree shown in FIG. 6.

In FIG. 10 there is shown the control circuitry 1000 used in the PLL synthesizer 300. The control circuitry 1000 includes a SAR/VCO timing control block that provides the SAR_CLK signal 1010, Reset_dividers signal 1004, an enable SAR signal 1012 and a reset_start signal 1014. Circuitry 1000 also includes an UP/Down edge detector 1006 which provides an up/down adjustment signal to the SAR blocks 106 in FIG. 1 and 304 in FIG. 3. The up/down adjustments are made depending on the phase relationship between PD_R and PD_V as shown in FIG. 8.

Figure 11:
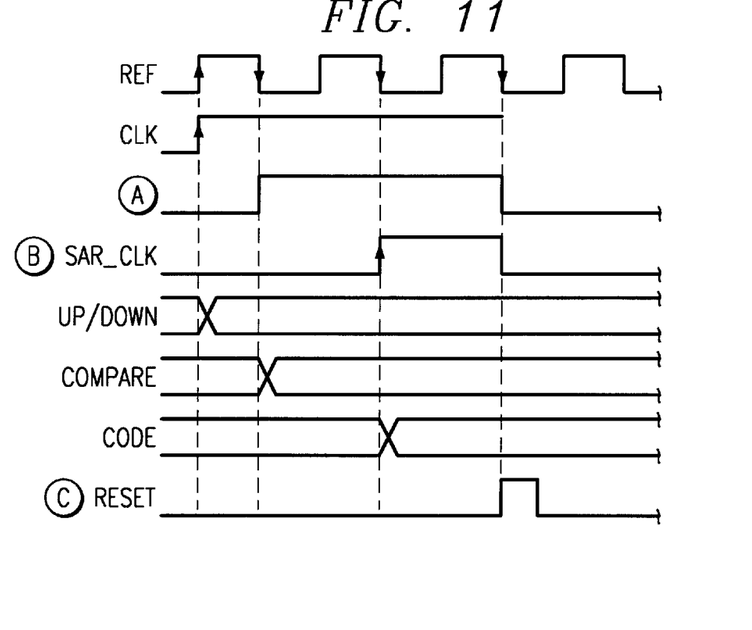
FIG. 11 shows a timing diagram highlighting the relationship between some of the different signal lines in the SAR/VCO timing controller of FIG. 10.

In FIG. 11 there is shown a timing diagram highlighting the relationship between some of the signals in FIG. 10. Including the "A" node 1002, "B" node 1014, "C" node 1004, as well as the reference (REF), clock (CLK) and a few other signals.

Option 2). No SAR, Interpolation approach used in the PLL shown in FIG. 2: In this implementation, the N divider count down is monitored by a fixed timer divided from the reference counter. When the timer times out, the value remaining in the counter gives an idea about the actual VCO frequency. The $\Delta N$ will therefore be converted to a $\Delta$code. With:

$$\Delta F_{tuning} = \Delta code \cdot \frac{Fr}{2^n},$$

where $\Delta F_{tuning}$ is the VCO frequency jump,

Fr is the VCO total range (e.g., 550 MHz), and n is the number of bits (e.g., 7 bits).

$$\Delta F_{prgr} = \Delta N \cdot F_{comp}$$

where, $\Delta F_{prgr}$ is the difference between actual, and N is the remaining value in the counter.

$$\Delta code \cdot \frac{Fr}{2^n} = \Delta N \cdot F_{comp},$$

$$\Delta code = \Delta N \cdot (2^n/Fr) \cdot F_{comp}.$$

So for example, for $F_{comp}$=200 KHz, n=7 and Fr=550 MHz, $$\Delta code = \Delta N/21 \cdot 48 = \Delta N/K.$$

For practical implementations "K" can be rounded to 16 or 32 which would simply mean dropping the 4 or 5 LSBs of $\Delta N$ in order to get the code increment ($\Delta$code). In an illustrative example where K=32:

In the first iteration: if ΔN=950, then Δcode=950/32=29, yielding an error of 19 to 20 counts. If the target frequency (F$_{target}$) is 2.4 GHz, N=12000 and F$_{comp}$=200 KHz, with ΔN=950, Factual 2.210 GHz. Then new FVCO=2.210+(550/128)·29=2334.609 MHz.

In the second iteration: F$_{actual}$=2334.609 MHz with an actual N or N$_a$=11673, and if F$_{target}$=2400 MHz with a target N or N$_t$=12000, which yields a ΔN=32, therefore Δcode=327/32=10, new F$_{VCO}$=2.334+550/128=2.3775 GHz.

In the third iteration: F$_{actual}$=2.3775 GHz with an actual N or N$_a$=11887, and if F$_{target}$=2.400 GHz with a target N or N$_t$=12000, which yields a ΔN=123, therefore Δcode=123/32=3, new F$_{VCO}$=2377.577+(550/128)·3=2.390 GHz, which is only 10 MHz away from the final frequency value in only 3 iterations (cycles). This implementation relies on good VCO linearity and it does not require a SAR as in the first embodiment.

Option 3). Hybrid Coarse Digital VCO Tuning Circuit used in PLL shown in FIG. 3: This implementation is a combination of both of the previous options. The first calibration cycle uses the linear interpolation principle to set the 4 MSBs of the VCO code. A simple reading of the B counter (11 bits) 302 equals the code increment. No extra hardware is needed for that. Each one of the 3 LSBs is then set using a 3 bit SAR circuit 304. The use of a SAR in the second phase helps overcome and minimize non-linearities that are intrinsic to the VCO 306 where:

$$F = \frac{1}{2\pi\sqrt{L\Sigma Ci}}$$

Usually, Vref voltage is set to the mid-range of the usual voltage of the output of the phase detector. In the present invention, the Vref temperature compensation circuit 126 (and the corresponding ones found in synthesizers 200 and 300) allows the level to be moved between two values as a function of the temperature to compensate for the small VCO temperature drift. The VCO's temperature drift is about 1% so, for 2 GHz, the total drift is about 20 MHz from T$_{minimum}$=−40° C. to Tmax=100° C. The phase detector output range and the analog varactor must cover this range in order to complete the lock.

Figure 12:
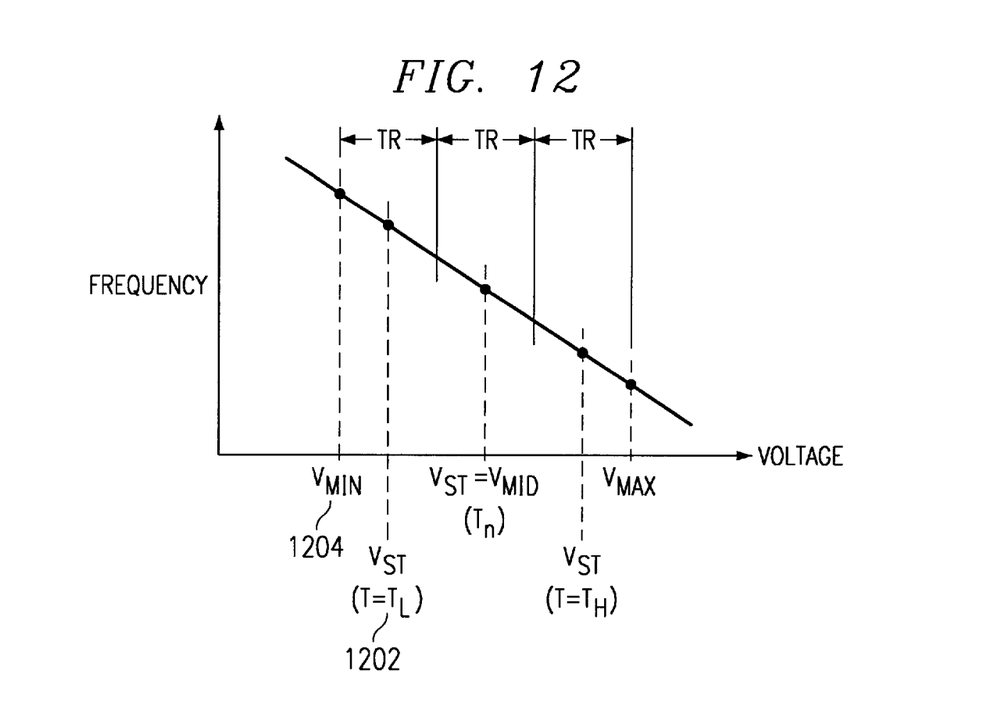
FIG. 12 shows a graph highlighting how the reference voltage is a function of temperature and the relationship between the frequency and voltage in accordance with the invention.

If Vref is always set at Vref nominal, then the analog varactor must cover almost twice the range when the temperature changes from T$_{min}$ to T$_{max}$. To overcome this problem, in accordance with the preferred embodiment, the Vref voltage is a function of the temperature and allows enough range (TR) to cover the temperature drift to the VCO. In FIG. 12, there is shown a graph illustrating the temperature ranges (TR) provided for minimum voltage (Vmin), middle voltage (Vmid) and maximum voltage (Vmax). The graph also highlights the inverse relationship between frequency and reference voltage. For example, for T=T$_L$ (minimum temperature) 1202, Vref is set near V$_{min}$ 1204 using the temperature compensation circuit 126 (and the corresponding ones for synthesizers 200 and 300) and with enough margin to allow the small frequency jump after tuning.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims. The present invention provides for a PLL that achieves coarse tuning in a minimum number of calibration cycles and with very good immunity to VCO non-linearity and parameter variations. The PLL of the present invention provides for a fully digital coarse tuning scheme that enables the use of low VCO gain during the lock conditions which helps improve the phase noise performance and reference feed through spur level. The present invention requires very small circuit overhead and is a low power architecture.

What is claimed is:

1. A method for tuning a voltage controlled oscillator (VCO) using a phase lock loop (PLL) in order to lock the VCO to a predetermined frequency using a VCO code having a plurality of bits, comprising the steps of:
   (a) placing the PLL in an open loop phase and while in the open loop phase, performing the following steps;
      (a1) using linear interpolation to set some of the VCO code's plurality of bits; and
      (a2) using a successive approximation register (SAR) to set the remaining bits of from amongst the plurality of bits in the VCO code; and
   (b) placing the PLL in a closed loop phase and while in the closed loop phase:
      (b1) completing the VCO frequency locking process by fine tuning the VCO.

2. A method as defined in claim 1, wherein in step (a1) the linear interpolation sets one or more of the most-significant bits (MSBs) of the VCO code's plurality of bits.

3. A method as defined in claim 1, wherein after step (a) and prior to performing step (b) a phase alignment between a phase detector reference signal (PD_R) and a phase detector VCO signal (PD_V) is performed.

4. A method as defined in claim 1, wherein after step (a) and prior to performing step (b):
   ensuring that the PLL filter voltage is equal to a reference voltage (Vref) set at the VCO control line in order to avoid the VCO frequency from changing when the PLL is placed in the closed loop phase in step (b), the reference voltage (Vref) is function of the temperature of the circuit.

5. A method as defined in claim 1, wherein in step (a1) an N divider count is monitored by a fixed timer divided from a reference counter and when the timer times out, the value remaining in the reference counter provides information about the actual VCO frequency.

6. A method as defined in claim 5, wherein in step (a2) a binary search algorithm compares the output of the reference counter to the N divider's overflow and an edge detector detects whether the VCO frequency is faster or slower than a program value and will accordingly increment or decrement the VCO code.

7. A method for tuning a voltage controlled oscillator (VCO) using a phase lock loop (PLL) in order to lock the VCO to a predetermined frequency using a VCO code having a plurality of bits, comprising the steps of:
   (a) placing the PLL in an open loop phase and while in the open loop phase:
      (a1) using a successive approximation register (SAR) to set the plurality of bits in the VCO code;
   (b) placing the PLL in a closed loop phase and while in the closed loop phase:
      (b1) completing the VCO frequency locking process by fine tuning the VCO; and
   wherein in step (a1) a binary search algorithm compares the output of a reference counter to an N divider's overflow and an edge detector detects whether the VCO frequency is faster or slower than a program value and will accordingly increment or decrement the VCO code, and the plurality of bits in the VCO code are set from most-significant-bit (MSB) to least-significant-bit (LSB) and one bit per clock cycle.

8. A method for tuning a voltage controlled oscillator (VCO) using a phase lock loop (PLL) in order to lock the VCO to a predetermined frequency using a VCO code having a plurality of bits, comprising the steps of:

(a) placing the PLL in an open loop phase and while in the open loop phase:
  (a1) using a successive approximation register (SAR) to set the plurality of bits in the VCO code;
(b) placing the PLL in a closed loop phase and while in the closed loop phase:
  (b1) completing the VCO frequency locking process by fine tuning the VCO; and
after step (a) and prior to performing step (b):
(c) ensuring that the PLL filter voltage is equal to a reference voltage (Vref) set at the VCO control line in order to avoid the VCO frequency from changing when the PLL is placed in the closed loop phase in step (b), the reference voltage (Vref) is function of the temperature of the circuit.

9. A method for tuning a voltage controlled oscillator (VCO) using a phase lock loop (PLL) in order to lock the VCO to a predetermined frequency using a VCO code having a plurality of bits, comprising the steps of:

(a) placing the PLL in an open loop phase and while in the open loop phase:
  (a1) using linear interpolation to set the VCO code's plurality of bits;
(b) placing the PLL in a closed loop phase and while in the closed loop phase:
  (b1) completing the VCO frequency locking process by fine tuning the VCO; and
in step (a1) an N divider count is monitored by a fixed timer divided from a reference counter and when the timer times out, the value remaining in the reference counter provides information about the actual VCO frequency.

10. A method as defined in claim 9, wherein after step (a) and prior to performing step (b):
ensuring that the PLL filter voltage is equal to a reference voltage (Vref) set at the VCO control line in order to avoid the VCO frequency from changing when the PLL is placed in the closed loop phase in step (b), this reference voltage (Vref) is function of the temperature of the circuit.

11. A method as defined in claim 9, wherein after step (a) and prior to performing step (b) a phase alignment between a phase detector reference signal (PD_R) and a phase detector VCO signal (PD_V) is performed.

* * * * *